United States Patent
Srikanth et al.

(10) Patent No.: US 10,176,124 B2
(45) Date of Patent: Jan. 8, 2019

(54) SCOREBOARD APPROACH TO MANAGING IDLE PAGE CLOSE TIMEOUT DURATION IN MEMORY

(71) Applicant: Intel Corporation, Santa Clara, CA (US)

(72) Inventors: Sriseshan Srikanth, Atlanta, GA (US); Lavanya Subramanian, Santa Clara, CA (US); Sreenivas Subramoney, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 31 days.

(21) Appl. No.: 15/477,069

(22) Filed: Apr. 1, 2017

(65) Prior Publication Data

US 2018/0285286 A1  Oct. 4, 2018

(51) Int. Cl.
| | |
|---|---|
| *G06F 13/16* | (2006.01) |
| *G06F 13/40* | (2006.01) |
| *G06F 9/38* | (2018.01) |
| *G11C 7/10* | (2006.01) |
| *G11C 7/22* | (2006.01) |

(52) U.S. Cl.
CPC .......... *G06F 13/161* (2013.01); *G06F 9/3838* (2013.01); *G06F 13/1673* (2013.01); *G06F 13/1689* (2013.01); *G06F 13/4059* (2013.01); *G11C 7/1072* (2013.01); *G11C 7/22* (2013.01)

(58) Field of Classification Search
CPC .... G06F 3/0611; G06F 3/0656; G06F 3/0673; G06F 9/3838; G06F 13/161; G06F 13/1673; G06F 13/1689; G06F 13/4059; G06F 2003/0691; G11C 7/1072; G11C 7/22

USPC .................................. 710/52; 711/105, 167
See application file for complete search history.

(56) References Cited

U.S. PATENT DOCUMENTS

| | | | | |
|---|---|---|---|---|
| 7,076,617 | B2 | 7/2006 | Dodd | |
| 2012/0059983 | A1* | 3/2012 | Nellans | G06F 12/0215 711/105 |
| 2012/0297131 | A1* | 11/2012 | Chung | G06F 12/0215 711/105 |
| 2018/0188994 | A1* | 7/2018 | Srikanth | G06F 3/0652 |

OTHER PUBLICATIONS

Awasthi et al., "Prediction Based DRAM Row-Buffer Management in the Many-Core Era", pp. 183-184, https://ieeexplore.ieee.org/stamp/stamp.jsp?tp=&arnumber=6113806. (Year: 2011).*

* cited by examiner

*Primary Examiner* — Gary J Portka
(74) *Attorney, Agent, or Firm* — Thorpe North & Western, LLP

(57) ABSTRACT

A technology is described for determining an idle page close timeout for a row buffer. An example memory controller may comprise a scoreboard buffer and a predictive timeout engine. The scoreboard buffer may be configured to store a number of page hits and a number of page misses for a plurality of candidate timeout values for an idle page close timeout. The predictive timeout engine may be configured to increment the page hits and the page misses in the scoreboard buffer according to estimated page hit results and page miss results for the candidate timeout values, and identify a candidate timeout value from the scoreboard buffer estimated to maximize the number of page hits to the number of page misses.

25 Claims, 8 Drawing Sheets

US 10,176,124 B2

SCOREBOARD APPROACH TO MANAGING IDLE PAGE CLOSE TIMEOUT DURATION IN MEMORY

BACKGROUND

Computing devices typically comprise a processor, memory, and a memory controller to provide the processor, as well as other components of the computing device, with access to the memory. The performance of such computing devices is influenced, at least in part, by the memory access latency of the memory subsystem. In general, memory access latency is associated with the time it takes for data to be read from, or written to, memory. In the case of dynamic random access memory (DRAM) for example, the memory access latency can include the time it takes for a memory controller to access a row of DRAM in a bank of memory, which can be highly dependent on the recent accesses to that same memory bank.

Figure 1:
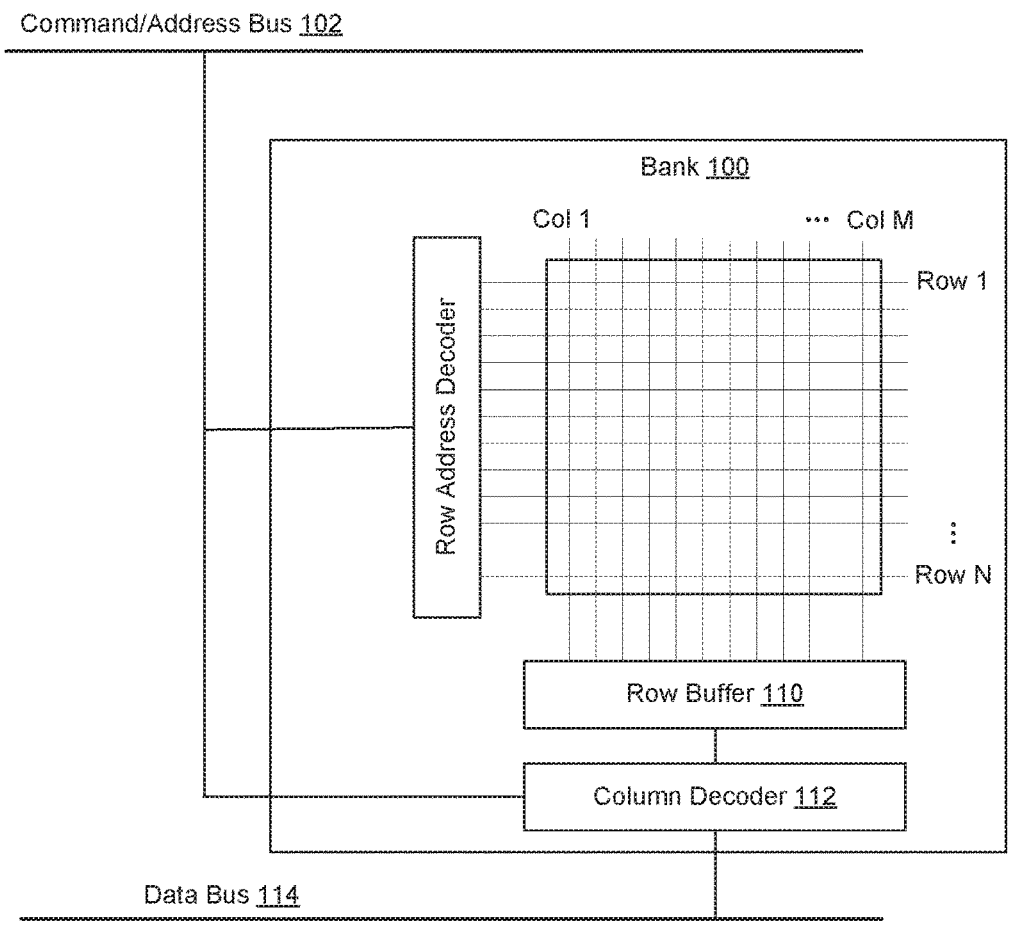
FIG. 1 illustrates a diagram of a memory array in accordance with one example embodiment.

Reference will now be made to the exemplary embodiments illustrated, and specific language will be used herein to describe the same. It will nevertheless be understood that no limitation on invention scope is thereby intended.

DESCRIPTION OF EMBODIMENTS

Although the following detailed description contains many specifics for the purpose of illustration, a person of ordinary skill in the art will appreciate that many variations and alterations to the following details can be made and are considered included herein.

Accordingly, the following embodiments are set forth without any loss of generality to, and without imposing limitations upon, any claims set forth. It is also to be understood that the terminology used herein is for describing particular embodiments only, and is not intended to be limiting. Unless defined otherwise, all technical and scientific terms used herein have the same meaning as commonly understood by one of ordinary skill in the art to which this disclosure belongs. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to provide a thorough understanding of various embodiments. One skilled in the relevant art will recognize, however, that such detailed embodiments do not limit the overall concepts articulated herein, but are merely representative thereof. One skilled in the relevant art will also recognize that the technology can be practiced without one or more of the specific details, or with other methods, components, layouts, etc. In other instances, well-known structures, materials, or operations may not be shown or described in detail to avoid obscuring aspects of the disclosure.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

As used herein, comparative terms such as "increased," "decreased," "better," "worse," "higher," "lower," "enhanced," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of phrases including "an example" or "an embodiment" in various places throughout this specification are not necessarily all referring to the same example or embodiment.

An initial overview of embodiments is provided below and specific embodiments are then described in further detail later. This initial summary is intended to aid readers in understanding the disclosure more quickly, but is not intended to identify key or essential technological features, nor is it intended to limit the scope of the claimed subject matter. Unless defined otherwise, all technical and scientific terms used herein have the same meaning as commonly understood by one of ordinary skill in the art to which this disclosure belongs.

In general, system memory can be configured according to various memory architectures. In one memory architecture example, memory cells are arranged as rows and columns in a two-dimensional array that is addressed by a corresponding array of word lines and bit lines. In the present disclosure, such an array of memory is referred to as a "memory bank" or "bank." One example of a type of memory that can be configured according to such an architecture is dynamic random-access memory (DRAM). When accessing data in such a memory array, an entire row of data is retrieved from the array into a row buffer. This row of data is referred to as a "page" of data, which can vary in size for different DRAM array sizes. For example, a 16-megabit (Mb) DRAM array is 4096 bits by 4096 bits, and therefore has 4096 bits in each row. The page of data in each row, therefore, would be 4096 bits, or 512 Bytes. Thereafter, the data in the page may be accessed for as long as the page remains in the row buffer. In the event that a subsequent data access request is received for data that is not in the page present in the open row, the row buffer needs to be emptied, or closed, and, in the case of DRAM, the page is written back to its row. Once the row buffer is empty, the page of data containing the subsequently requested data is retrieved from the appropriate row in the memory array into the row buffer. The memory controller empties the row buffer (i.e., "closes the row") by issuing a precharge (PRE) command, and "opens the row" by issuing an activate (ACT) command, which causes the page of data in the activated row in the memory array to be transferred into the row buffer.

More specifically, a host, such as a host processor, sends memory access requests to a memory controller for processing. The memory controller determines the physical location of the data associated with the memory access request, and generates memory commands to retrieve the data from the appropriate DRAM memory bank 100, shown as an example in FIG. 1. DRAM memory cells in the bank 100 are organized in a two-dimensional array, which is addressed by an array of bit lines (Col 1 to Col M) and word lines (Row 1 to Row N). The memory commands are sent to the bank 100 from the memory controller along a command address bus 102, causing the rank (not shown) and bank 100 addressed by the memory access request to be opened. The row address of the memory access request is sent via the command and address bus 102 to a row address decoder 106, along with an ACT command. The row address decoder 106 selects the word line for the row addressed in the memory access request, and the ACT command causes the row address decoder 106 to move the data contents of the selected row from the DRAM array into a row buffer 110, an operation that is often referred to as "opening the row." The column address of the memory access request is sent to a column decoder 112, along with a column access strobe (CAS) command. With the addressed row data now open in the row buffer 110, the CAS command causes the column address decoder 112 to read out data from the open row buffer 110 at the column positions associated with the column address. The data that has been read out into the column decoder 112 is sent via a data bus 114 to the memory controller, which responds to the data request.

The state of a row buffer influences memory access latency based on whether the row is open or closed, and if open, whether a memory request results in a page hit or a page miss for data in the open row. In the case of a page miss, the row is closed by issuing a PRE command, and the row containing the requested data is opened by issuing an ACT command, which transfers the requested data into the row buffer. The PRE command incurs a latency associated with emptying the row, and in some cases transferring the data back into the memory array. The ACT command incurs a latency associated with transferring the requested data from the memory array into the row buffer. In situations where the subsequent request for data produces a hit for the data in the page that is present in the row buffer, no PRE or ACT command latencies are incurred, and the requested data can be transferred directly from the row buffer to the memory controller by issuing a CAS command. In situations where the subsequent request for data produces a miss for the data in the page that is present in the row buffer, the row is closed and the page of data from the row containing the requested data is transferred into the row buffer, thus incurring both PRE and ACT command latencies. In situations where the row buffer is empty, the subsequent data request can be filled by transferring the page of data from the row containing the requested data into the row buffer, thus incurring an ACT command latency, but not a PRE command latency.

The time that a row is left open can greatly impact the performance of a memory subsystem, as well as the performance of an associated computing system. When a CAS command is issued to an open row buffer, the requested columns of data are transferred to the memory controller, and an idle page close timeout is initiated. If the idle page close timeout expires with no subsequent memory access requests being received, a PRE command is issued to close the open row, and the row buffer is emptied. When a row buffer is empty, the next memory access request will be filled by issuing an ACT command to populate the row buffer, a situation that is preferable to a miss, due to avoiding the PRE command latency, but less preferable to a hit.

The duration of an idle page close timeout can have an impact on memory access latency and performance, and as such, determining how long to keep an idle page open can be an effective technique for improving system performance. Memory access latency can be improved by determining an idle page close timeout that balances the duration that a row is left open in order to maximize page hits against and the duration that the row is left open in order to minimize page misses. As an example, for a memory access request for data that is in the same page as the previous request, but that arrived after the row had been closed, increasing the duration of the idle page close timeout (i.e., the timeout duration) would result in a hit, and thus decrease the memory latency by avoiding the ACT command. As far as requested data that would hit is concerned, increasing the timeout duration for an empty row buffer would increase the number of overall hits. Thus, as a general concept, increasing the timeout duration for empty buffers to increase the number of hits beneficially reduces the memory access latency. On the other hand, in an example where a memory access request for data that was in a different page as the previous request, and that arrived before the row has been closed, generates a miss, and thus both the PRE and ACT command latencies are incurred. Decreasing the timeout duration would empty the row buffer prior to the arrival of the memory access request, which would now incur the ACT command latency, but not the PRE command latency, and thus decrease the memory latency by avoiding the PRE command. As far as requested data that results in a miss is concerned, decreasing the timeout duration for the open row buffer would decrease the number of overall misses. Thus, as a general concept, decreasing the timeout duration for open rows that generate misses to incoming data requests in order to decrease the number of misses beneficially reduces the memory access latency. By balancing these two alternatives, an optimal timeout duration can be determined that maximizes hits while minimizing misses. A memory controller can thus be configured to optimize the timeout duration, which can be periodically updated according to changes in the nature of the data being accessed.

The presently disclosed technology relates to predicting memory access behavior for different idle page close timeout values using a score boarding technique. The technology can reduce memory latency and improve application performance by increasing row buffer hit rates, which in one example, can be a function of the number of hits to the number of misses for a given timeout duration. The score boarding mechanism can be used to evaluate predicted row buffer hits and row buffer misses for each timeout value of a set of candidate timeout values for idle page close timeout. These predicted row buffer hits and row buffer misses for a particular timeout value may be reflective of a row buffer hit rate for a row buffer having the particular timeout value.

At the end of a defined interval during which the set of candidate timeout values are evaluated against a memory access request data set, the row buffer hits and row buffer misses are determined for each timeout value. The candidate timeout value maximizing the number of hits and minimizing the number of misses (i.e. the row buffer hit rate) is thus selected as the timeout value having the optimized memory access latency. If the row buffer hit rate reduces memory access latency over that of the current timeout value for the buffer row's idle page close timeout, the idle page close timeout for the row buffer can be updated to the new timeout value. The process can be repeated for subsequent defined intervals and for subsequent memory access request data sets, such that after each defined interval, a determination as to whether to update the current timeout value for the idle page close timeout with a candidate timeout value can be made. As the data being accessed in a computing environment can change over time, so can the relatedness between subsequent data requests and other relevant access characteristics. An optimal idle page close timeout that is optimal for the access characteristics of one set of data may not be optimal for subsequent data having different access characteristics. As such, memory access requests that are being processed by a memory controller can be processed, in some cases in parallel, through a predictive timeout engine to optimize the timeout value of the idle page close timeout. In one example, the predictive timeout engine can determine, for each memory access request processed by the memory controller, what the results for the row buffer would have been for each candidate timeout value, given the page of data from the previous memory access request. In other words, the data page from the previous memory access request is known, and as such, it is known whether or not the data associated with the memory access request being processed by the predictive engine is in the previous data page. Knowing that the data in the predictive engine will result in a page hit, for example, the minimum timeout value from the candidate timeout values that leaves the previous page in the row buffer can be determined by the predictive engine. This minimum timeout value can be referred to as the "hit conversion," or the minimum timeout value from the candidate timeout values where the row buffer converts from empty to a page hit. Similarly, knowing that the data in the predictive engine will result in a page miss, the maximum timeout value from the candidate timeout values that avoids a page miss and leaves the row buffer empty can be determined by the predictive engine. This maximum timeout value can be referred to as a "miss conversion," or the maximum timeout value from the candidate timeout values where the row buffer converts from a page miss to empty. As such, for each memory access request processed, either a hit conversion or a miss conversion is recorded in a scoreboard buffer associated with the associated candidate timeout. The optimal timeout value from the set of candidate timeout values can then be determined from the scoreboard buffer by, in one example, maximizing the number of hits and minimizing the number of misses.

The set of candidate timeout values can be selected based on any useful criteria. In one nonlimiting example, the set of candidate timeout values can be predetermined, either through calculation, testing, empirical observation, or the like. In another nonlimiting example, the set of candidate timeout values can be selected based on various heuristics, including past performance, past performance of data having similar characteristics to the subsequent memory access request data set, characteristics or predicted characteristics of the subsequent memory access request data set, spatial locality of data associated with the subsequent memory access request data set, random selection within a defined range, or the like, including combinations thereof. In such cases, the candidate set of timeout values can be fixed at the beginning of the subsequent interval of testing, or the candidate set of timeout values can be altered during the testing interval in response to the memory access request data set. Such alterations in the candidate set of timeout values can be a result of the candidate timeout values spanning a suboptimal range, or in order to alter the course or fine tuning of the period(s) between the candidate timeout values. Such changes in candidate timeout values can be a result of an inaccurate heuristic or other predication of the performance of a particular memory access request data set, changes in some characteristic of the memory access request data from which the data set is generated, or the like.

The memory can comprise various types memory, which can include any of a variety of memory architectures that provide addressable storage locations where a portion of the memory is retained in an accessible state for a configurable period of time. The memory can include any type of volatile or nonvolatile memory, which is not considered to be limiting. Volatile memory, for example, is a storage medium that requires power to maintain the state of data stored by the medium. Non-limiting examples of volatile memory can include random access memory (RAM), such as dynamic random access memory (DRAM), synchronous dynamic random access memory (SDRAM), and the like, including combinations thereof. SDRAM memory can include any variant thereof, such as single data rate SDRAM (SDR DRAM), double data rate (DDR) SDRAM, including DDR, DDR2, DDR3, DDR4, DDR5, and so on, described collectively as DDRx, and low power DDR (LPDDR) SDRAM, including LPDDR, LPDDR2, LPDDR3, LPDDR4, and so on, described collectively as LPDDRx. In some examples, DRAM complies with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209B for LPDDR SDRAM, JESD209-2F for LPDDR2 SDRAM, JESD209-3C for LPDDR3 SDRAM, and JESD209-4A for LPDDR4 SDRAM (these standards are available at www.jedec.org; DDR5 SDRAM is forthcoming). Such standards (and similar standards) may be referred to as DDR-based or LPDDR-based standards, and communication interfaces that implement such standards may be referred to as DDR-based or LPDDR-based interfaces. In one specific example, the system memory can be DRAM. In another specific example, the system memory can be DDRx SDRAM. In yet another specific aspect, the system memory can be LPDDRx SDRAM.

In general, DRAM memory, for example, is organized in a hierarchical fashion, with a memory-level parallelism organization that provides increased bandwidth at certain levels of the hierarchy. For example, one high-level division of memory is a channel, which is the collection of all DRAM that share a common physical link to a host (e.g. a processor). Depending on the specific configuration, in some cases DRAM can be mounted on a dual in-line memory module (DIMM). In such cases, a memory channel can include one or more DIMMs, with each DIMM having a plurality of DRAM chips mounted thereon, either on one or both sides of the DIMM. All of the DRAM chips on one side of a DIMM is known as a rank, and each DRAM chip is comprised of multiple DRAM banks of memory arrays of bit-level DRAM memory cells.

Nonvolatile memory (NVM) is a persistent storage medium, or in other words, a storage medium that does not require power to maintain the state of data stored therein. Nonlimiting examples of NVM can include planar or three-dimensional (3D) NAND flash memory, NOR flash memory, cross point array memory, including 3D cross point memory, phase change memory (PCM), such as chalcogenide PCM, non-volatile dual in-line memory module (NVDIMM), ferroelectric memory (FeRAM), silicon-oxide-nitride-oxide-silicon (SONOS) memory, polymer memory (e.g., ferroelectric polymer memory), ferroelectric transistor random access memory (Fe-TRAM), spin transfer torque (STT) memory, nanowire memory, electrically erasable programmable read-only memory (EEPROM), magnetoresistive random-access memory (MRAM), write in place non-volatile MRAM (NVMRAM), nanotube RAM (NRAM), and the like, including combinations thereof. In some examples, NVM can comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at www.jedec.org). In one specific example, the memory can be 3D cross point memory. In another specific example, the memory can be STT memory.

Figure 2:
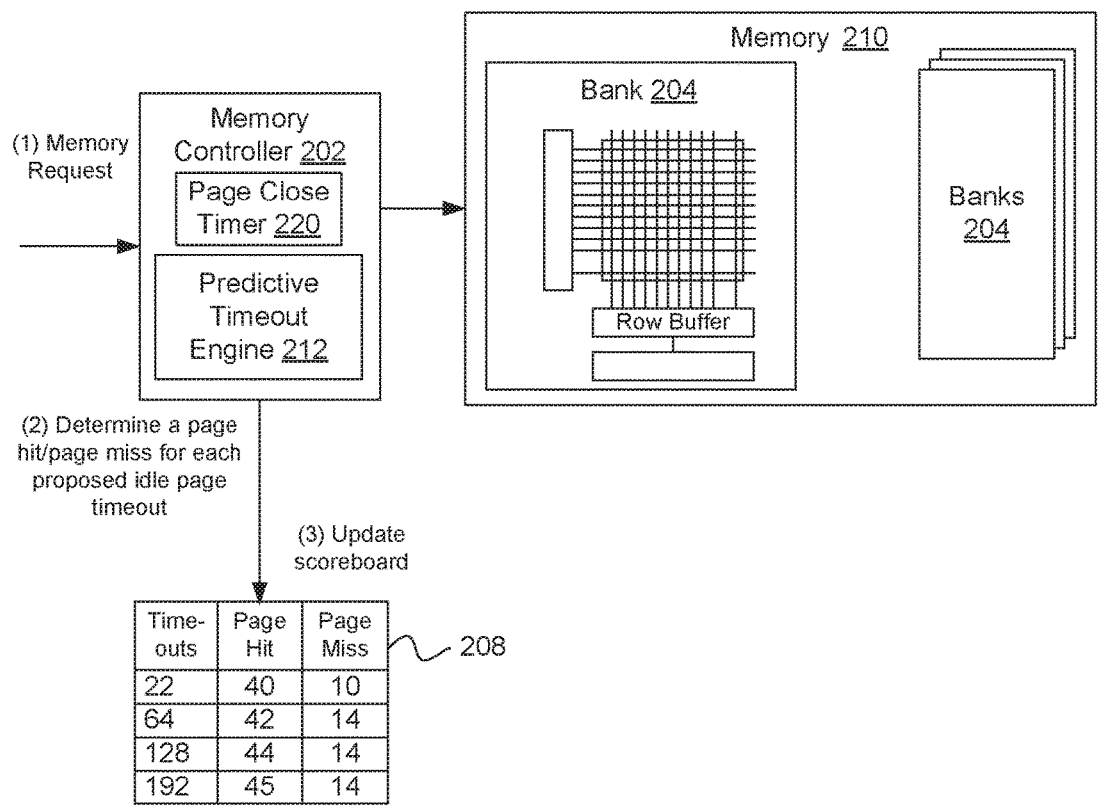
FIG. 2 is a diagram of a memory and memory controller and a method for updating a scoreboard in accordance with an example embodiment.

FIG. 2 is a diagram illustrating an example of a memory controller 202 communicatively coupled to a memory 210 comprising a plurality of memory banks 204. In one example of simplified functionality, the memory controller 202 receives a memory access request from a host for data in a bank 204 of the memory 210. In response to the memory access request, the memory controller 202 generates memory commands that retrieves all of the data (i.e., a page of data) from the memory array row in the appropriate bank 204 containing the requested data, which is placed into that bank's row buffer, thus allowing access to the data in the page. The data is retrieved from the page of data in the row buffer and sent to the memory controller 202 to fill the memory access request. Thereafter, the page remains open and accessible in the row buffer for a duration specified by the idle page close timeout, which is tracked by a page close timer 220. In the event the memory controller 202 receives a subsequent memory access request for data in the open row prior to expiration of the timeout duration (i.e., a page hit), the data for the subsequent memory access request is pulled from the page in the open row buffer, and the idle page close timeout is reset in the page close timer 220, thus restarting the duration to close the idle page. In the event a subsequent memory access request is received for data that is not in the page in the open row buffer prior to the expiration of the idle page close timeout (i.e., a page miss), the memory controller 202 issues a PRE command to close the open row and an ACT command to retrieve, into the now empty row buffer, the page of data containing the requested data from the appropriate row of the bank 204. The requested data is then sent from the row buffer to the memory controller 202, and the page close timer is started for the idle page close duration. In the event a subsequent memory access request is not received prior to the expiration of the idle page close timeout, the memory controller 202 issues a PRE command to empty the row buffer and close the page.

As described above, a timeout value (i.e. duration) of an idle page close timeout can have an effect on memory latency associated with accessing data in a bank 204 of the memory 210. Accordingly, the present technology evaluates different candidate timeout values for an idle page close timeout to determine a timeout value or duration that results in lower memory latency overhead compared to a current timeout value of the idle page close timeout. As illustrated in FIG. 2, a scoreboard buffer 208 holds the number of page hits and page misses for the different candidate timeout values, from which an optimal timeout value can be determined for the memory access request data set being tested, or rather, for memory access requests for data having similar access characteristics.

The scoreboard buffer 208 is configured to store a number of page hit conversions and a number of page miss conversions a plurality of candidate timeout values for idle page close timeouts. For example, a scoreboard buffer 208 may comprise storage at the memory controller 202. In one example, the scoreboard buffer 208 includes a plurality of candidate timeout values, each having an associated hit conversion counter and a miss conversion counter, both of which are updated as memory access requests are processed by the predictive engine 212.

In one example, the memory controller 202 is configured to determine a page hit or a page miss for each timeout value included in the candidate set of timeout values in response to receiving a memory access request. As has been described, a page hit is a memory access request for data that is present in a data page in an open row buffer 206, and a page miss is a memory access request for data that is not present in a data page in an open row buffer 206. A page hit is associated with lower memory latency because actions associated with higher memory latency, namely, closing a page and opening another page, are not performed. A page miss is associated with higher memory latency because due to the need to close the open page and open a new page having the requested data. In another example, the memory controller 202 is configured to determine a page hit conversion or a page miss conversion for each timeout value included in the candidate set of timeout values in response to receiving a memory access request, and for each memory access request, only the hit or miss conversion is recorded in the scoreboard buffer for the associated candidate timeout value.

The memory controller 202 includes a predictive timeout engine 212 configured to determine for each memory request received by the memory controller 202 whether a candidate timeout value, if implemented, would have resulted in a page hit or a page miss for the memory request. For example, in response to receiving a memory request, the memory controller 202 may, in parallel to servicing the memory request, send a memory request notice to the predictive timeout engine 212 that the memory request was received. In one example, the memory controller includes a parallel memory controller channel which is used to send a notice to the predictive timeout engine 212 that the memory controller 202 received a memory request.

In response to receiving a notice that the memory controller 202 received a memory request, the predictive timeout engine 212, in one example, evaluates each candidate timeout value to determine whether the timeout value would have resulted in a page hit or a page miss, and then increments a page hit count (or hit conversion count) or a page miss count (or a miss conversion count) for the timeout value in the scoreboard buffer 208. As an illustration, in response to a memory request notice, a first timeout value in a set of candidate timeout values may be evaluated to determine whether the first timeout value would have resulted in a page hit or a page miss, whereupon a page hit counter or a page miss counter for the first timeout value may be incremented in the scoreboard buffer 208 accordingly. The process may be repeated for a second timeout value, a third timeout value, and so on until each timeout value in the set of candidate timeout values has been evaluated. This method of evaluating timeout values for an idle page close timeout is described in greater detail later in association with FIG. 3.

In another example, the memory controller 202 provides the predictive timeout engine 212 with a notice regarding the result of a memory request, namely, whether the memory request resulted in a page hit or a page miss. In the case that the memory request resulted in a page hit, the predictive timeout engine 212 identifies a minimum timeout value included in a set of timeout values that is associated with the page hit result. More specifically, the minimum timeout value may be the lowest value of the timeout values that an idle page close timeout can be set to in order for the memory request to result in a page hit.

In one example, a scoreboard of page hits and page misses can be estimated for memory requests associated with any application and/or process. In another example, a scoreboard of page hits and page misses can be estimated for memory requests associated with specific applications and/or processes. Logic used to compute page hit increments and page miss increments are performed using a set of comparators and gates included in the memory controller 202.

Figure 3:
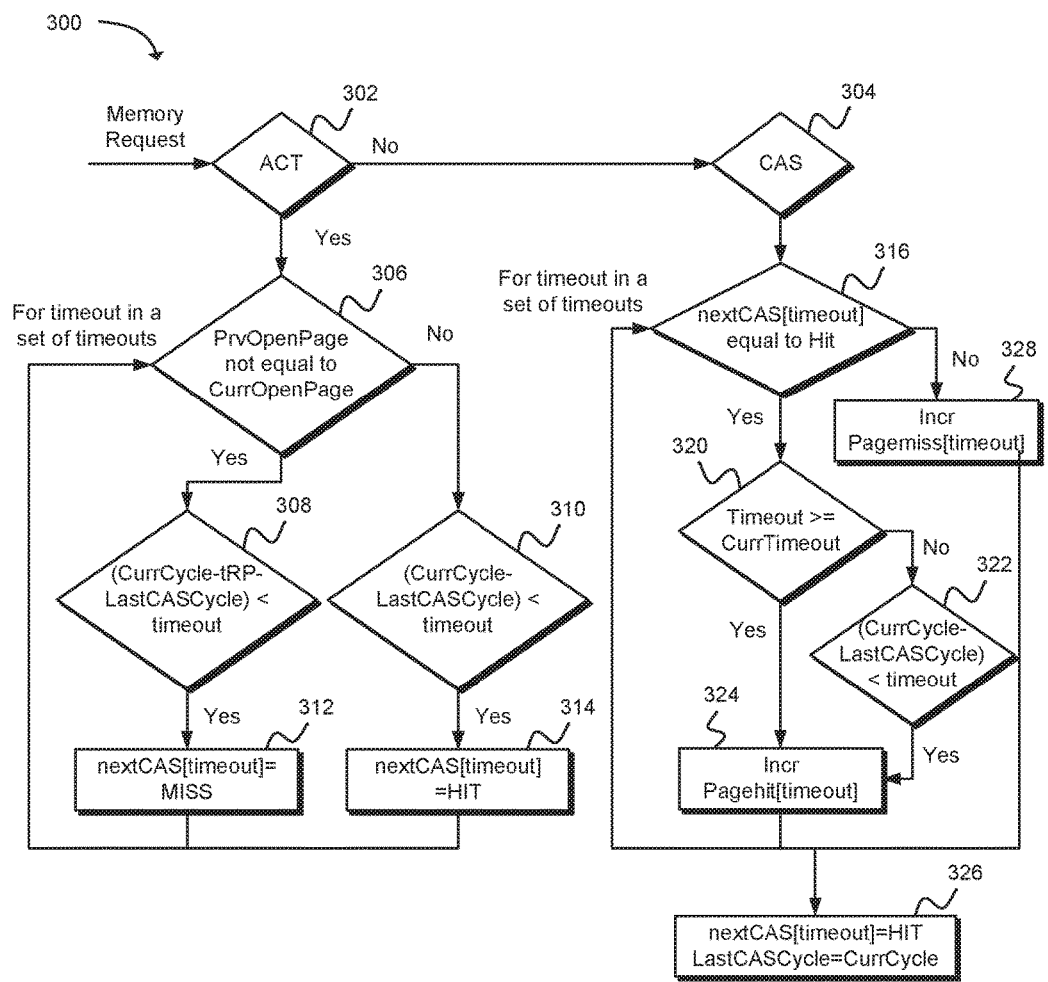
FIG. 3 is a flow diagram illustrating an example method for determining page hits and page misses for timeout values in a set of timeout values in accordance with an example embodiment.

FIG. 3 is a flow diagram illustrating an example method 300 for determining page hits and page misses for timeout values in a set of timeout values and respectively incrementing page hit counters and page miss counters for the timeout values. The method 300 may be configured to estimate page hits and page misses for the timeout values based in part on determining empty-to-hit conversions and miss-to-empty conversions for the timeout values with respect to incoming memory requests.

The method 300 performs conversions that include miss-to-empty conversions, empty-to-hit conversions, and empty-to-miss conversions. These conversions can be performed so that memory latency associated with a memory request that results in an empty condition or a miss condition of a row buffer can be converted into a page hit result or a page miss result based on a subsequent memory request. The estimated page hits and page misses are determined in respect to a time of a previous CAS (Column Access Strobe) command, where the CAS command may access data in an open page in a row buffer. For example, a miss-to-empty conversion may comprise converting a page miss result for a memory request to a page empty result for the memory request, thereby initializing an empty-to-hit conversion or an empty-to-miss conversion. In other words, a miss-to-empty conversion "sets the stage" for an empty-to-hit conversion or an empty-to-miss conversion.

An empty-to-hit conversion comprises converting a page empty result to a page hit result when a first memory request is for a closed page and a second memory request is for the same page that is now open in the row buffer. Whereas, an empty-to-miss conversion comprises converting a page empty result to a page miss result when the second memory request is for a different page than the page open in the row buffer.

The conversions described above reflect the change in memory latency in terms of page hit counts and page miss counts for different timeout values. In doing so, evaluating memory latency for a timeout value can be simplified to evaluating just the page hits and the page misses for the timeout value.

The method 300 can be performed by a memory controller configured with a predictive timeout engine. In response to receiving a memory request (e.g., a memory access request to read data in a page or write data to a page), the memory controller, in parallel, services the memory request and evaluates the set of timeout values using the predictive timeout engine. For example, the memory controller sends a memory request notice to the predictive timeout engine that indicates that a memory request has been received at the memory controller.

In response to receiving a notice that a memory request has been received at the memory controller, the predictive timeout engine is configured to determine, as in block 302, whether the memory request results in the memory controller having to open a page using an ACT command. In the case that the memory request results in an ACT command that opens a page, then as in block 306, a determination whether the current open page (CurrOpenPage) is different from the preceding open page (PrvOpenPage). For example, the preceding open page may have been closed due to a page miss or closed due to the expiration of an idle page close timeout.

In the case that the preceding open page is different than the current open page, then as in block 308, a determination is made for each candidate timeout value in the set of timeout values whether the ACT would have been performed prior to the expiration of the candidate timeout value. In other words, a determination is made for each candidate timeout value whether the memory request would have resulted in a page miss that caused a page to be closed and the current page to be opened. In doing so, the page miss for the candidate timeout is preserved by setting a timeout result variable (nextCAS[timeout]) to "miss", as in block 312, and a page miss counter for the candidate timeout is incremented (as in block 324) the next time that a memory request results in a CAS command. Block 308 illustrates that the page miss determination is made by identifying whether a cycle difference (the current cycle (CurrCycle) minus a row precharge delay (tRP) minus the last CAS cycle (LastCASCycle)) is less than the candidate timeout value being evaluated. Block 312 illustrates that the timeout result variable (nextCAS[timeout]) is set to a value representing a page miss.

In the case that in block 306, a determination is made that the preceding open page is the same as the current open page, then as in block 310, a determination is made for each candidate timeout value in the set of timeout values whether the ACT would have been performed as a result of the row buffer being empty due to a candidate timeout value expiring and causing previous page to be closed. In other words, each candidate timeout value is evaluated to determine whether a timeout value would have resulted in the row buffer being empty. In the case that a determination is made that a candidate timeout value does result in an empty row buffer, then as in block 314, an empty-to-hit conversion is performed by setting the timeout result variable to "page hit". Block 310 illustrates that the page empty determination is made by identifying whether a cycle difference (the current cycle (CurrCycle) minus the last CAS cycle (LastCASCycle)) is less than the candidate timeout value being evaluated. Block 314 illustrates that the timeout result variable (nextCAS[timeout]) is set to a value representing a page hit.

Returning to block 302, in the case that the memory request does not result in an ACT command, and as in block 304, a CAS command is performed, then as in block 316, for each candidate timeout value in the set of timeout values, a timeout result variable (nextCAS[timeout]) for a candidate timeout value is evaluated to determine whether the timeout result variable is set to a value representing a page hit or a value representing a page miss. In the case that the timeout result variable for a candidate timeout value is equal to a page miss, as in block 328, a page miss counter (Pagemiss [timeout]) for the candidate timeout value is incremented in the scoreboard buffer.

In the case that the timeout result variable for the candidate timeout value is equal to a page hit, then as in block 320, a determination whether the candidate timeout value is greater than or equal to the current value of the idle page close timeout is made. In the case that the candidate timeout value is greater than or equal to the current value of the idle page close timeout, then as in block 324, a page hit counter (Pagehit[timeout]) for the candidate timeout value is incremented in the scoreboard buffer.

In the case where the candidate timeout value is less than the current value of the idle page close timeout, then as in block 322, a determination whether a cycle difference (the current cycle (CurrCycle) minus the last CAS cycle (LastCASCycle)) is less than the candidate timeout value being evaluated is made; and if the cycle difference is less than the candidate timeout value, the page hit counter (Pagehit[timeout]) for the candidate timeout value is incremented in the scoreboard buffer. For example, where the current value of the idle page close timeout is 64 and the candidate timeout is 32. If the CurrCycle−LastCASCycle<32, the page hit counter (Pagehit[timeout]) is incremented. However, if CurrCycle−LastCasCycle>32, then the candidate timeout is predicted to expire, resulting in a page empty. Finally, as in block 326, the timeout result variable (nextCAS[timeout]) for the proposes timeout value may be initialized to a value representing a page hit and the last CAS cycle (LastCAS-Cycle) is set to the current CAS cycle (CurrCycle).

The timeout result variable referred to above may be an array of timeout results for candidate timeout values in a set of timeout values. The timeout results array may be stored in a results buffer. Additionally, variables for a current open page, a previous open page, current CAS cycle, and last CAS cycle may be stored in a variable buffer. While the method 300 in FIG. 3 illustrates one example method that can be used to evaluate candidate timeout values for an idle page close timeout to determine a number of page hits and page misses that may result in decreasing memory latency, other methods for evaluating candidate timeout values are also within the scope of this disclosure.

Figure 4:
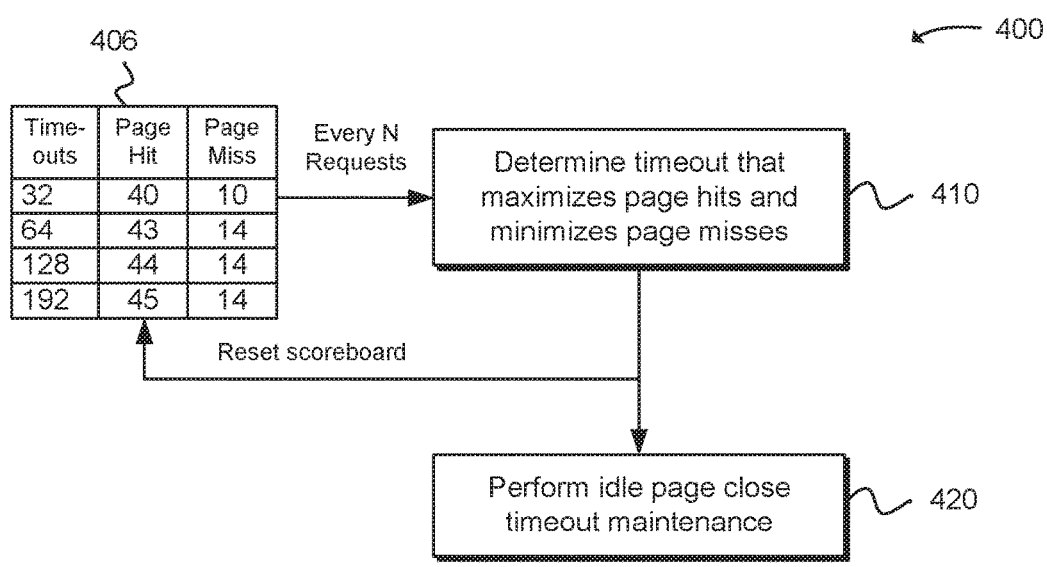
FIG. 4 is a flow diagram that illustrates an example method for determining a timeout value for an idle page close timeout in accordance with an example embodiment.

FIG. 4 is a flow diagram illustrating a method 400 for determining a timeout value for an idle page close timeout for a row buffer of a bank of memory. FIG. 4 illustrates a high-level depiction of a scoreboard buffer 406 used to track page hits and page misses for each candidate timeout value included in a set of timeout values. As described above, the page hits and page misses for the timeout values in the scoreboard buffer 406 are estimated based on determining empty-to-hit and empty-to-miss conversions for each incoming memory request, measured in respect to the time of a previous CAS command.

Periodically (e.g., after a predetermined number of memory requests, a number of processor cycles, or another time window), or from time-to-time (e.g., a time that takes into account application phase behavior, such as a criticality of a memory request), a timeout value is determined for an idle page close timeout that may improve memory latency for a row buffer. As an example, as part of receiving memory requests, the memory controller may be configured to send notices of the memory requests to the predictive timeout engine described earlier. After a predetermined number of memory request, the predictive timeout engine may be configured to determine a candidate timeout value that may result in decreasing memory latency, if set as the idle page close timeout for a row buffer. The scoreboard buffer 406 may be reset (re-initialized) in accordance with each cycle of determining a candidate timeout value.

In one example, as in block 410, a candidate timeout value that maximizes page hits and minimizes page misses may be determined by evaluating page hits and page misses for each candidate timeout value included in a set of timeout values. For example, page hits and page misses for a timeout value are retrieved from the scoreboard buffer 406 and the predictive timeout engine calculates a memory latency score for the timeout value using the page hits and page misses. In one example, calculating a memory latency score includes calculating a ratio of page hits to page misses for a candidate timeout value. In another example, calculating a memory latency score includes calculating a percentage of page hits to page misses for a candidate timeout value. A memory latency score is calculated for each candidate timeout value represented in the scoreboard buffer 406 and a candidate timeout value having a memory latency score associated with maximizing page hits and minimizing page misses is identified.

Figure 7:
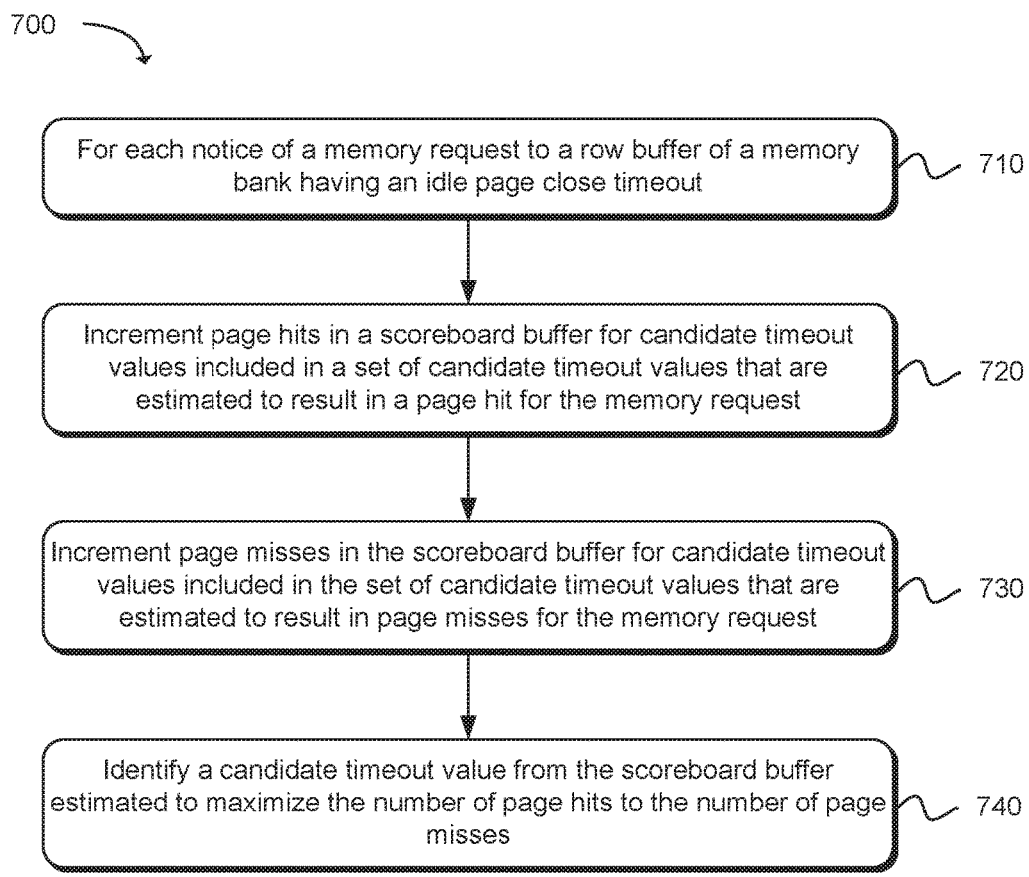
FIG. 7 is a flow diagram that illustrates an example method for determining an idle page close timeout for a row buffer in accordance with an example embodiment.

As a specific example using the example scoreboard buffer 406 illustrated in FIG. 4, a memory latency score can be calculated for each of the timeout values using the method illustrated in FIG. 7. For example, a memory latency score may be calculated for a timeout value in the scoreboard buffer 406 by first calculating a hit increase and a miss increase for the timeout value over a current timeout value:

hit increment=page hit [candidate timeout value]−page hit [current timeout value];

miss increment=page miss [candidate timeout value]−page miss [current timeout value];

and second, calculating the difference between the hit and miss increase for the timeout value:

memory latency score=hit increment−miss increment.

Accordingly, using the method above where the current timeout value is 32, the memory latency scores for the remaining timeout values in the scoreboard buffer 406 would be:

memory latency score [timeout value 64]=−1;
memory latency score [timeout value 128]=0;
memory latency score [timeout value 192]=1.

Thus, in evaluating the memory latency scores for the timeout value in the scoreboard buffer, the timeout value 192 may result in maximizing memory latency for the row buffer because the hit increase for the timeout value outweighs the miss increase for the timeout value.

In one example, weights can be applied to the page hits or page misses for candidate timeout values represented in the scoreboard buffer 406. The weights can be used to skew memory latency scores for candidate timeout values in a way that better estimates memory latency associated with the candidate timeout values. For example, weights can be applied to page hits in order to emphasize the impact of a page hit over a page miss, or alternatively, the weights can be applied to page misses to emphasize the impact of the page misses.

After identifying a candidate timeout value having a memory latency score that may be associated with maximizing page hits and minimizing page misses, the candidate timeout value is selected as the value for the idle page close timeout for a row buffer. For example, as in block 420, idle page close timeout maintenance for the row buffer is performed by updating the value of the idle page close timeout to the candidate time out value.

In another example, a candidate timeout value associated with a maximum number of row hits is selected as the value for the idle page close timeout for a row buffer. For example, page hits for the timeout values represented in the row buffer 406 can be evaluated and a timeout value associated with the greatest number of page hits as compared to page hits for other timeout values represented in the scoreboard buffer 406 may be identified, and the candidate timeout value is selected as the value for the idle page close timeout for a row buffer. Alternatively, a candidate timeout value associated with a minimum number of row misses may be selected as the value for the idle page close timeout for a row buffer.

Figure 5:
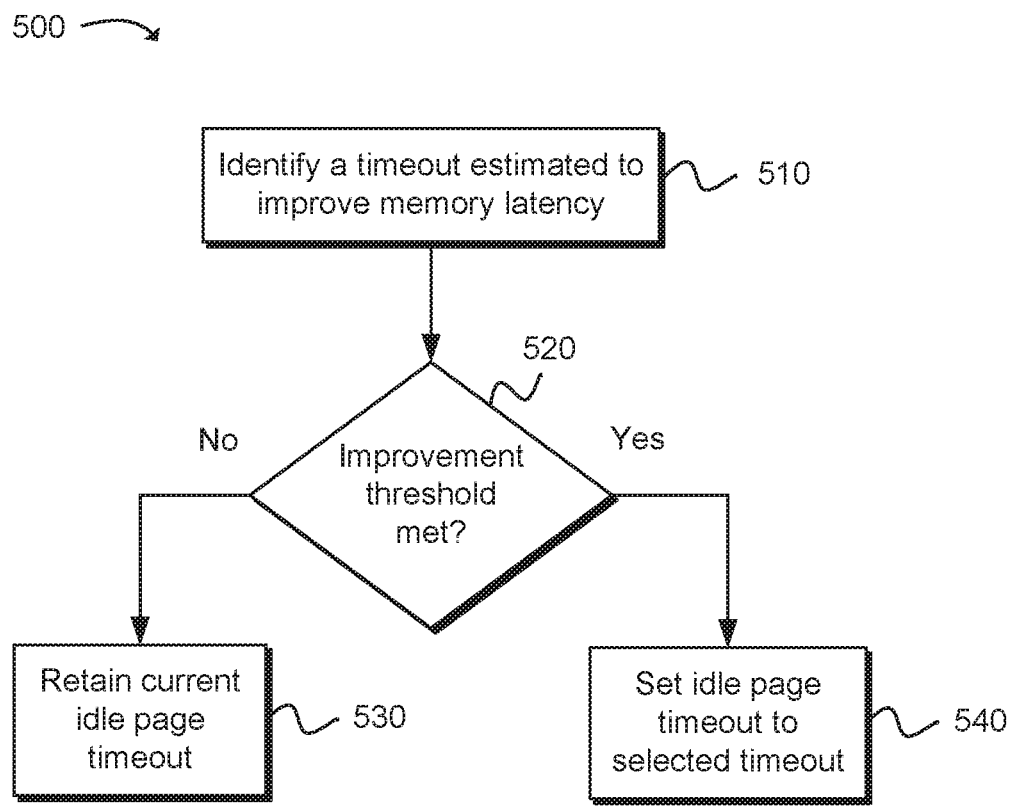
FIG. 5 is a flow diagram illustrating an example method for determining a timeout value for an idle page close timeout using an improvement threshold in accordance with an example embodiment.

FIG. 5 is a flow diagram that illustrates an example method 500 of using an improvement threshold in determining whether to set an idle page close timeout to a candidate timeout value identified using one of the methods described above. As in block 510, a candidate timeout value estimated to improve memory latency is identified. For example, based on estimated page hits and page misses for the candidate timeout value, a determination is made that the candidate timeout value may result in improved memory latency as compared to memory latency associated with a current value of an idle page close timeout.

As in block 520, a determination whether the estimated improvement in memory latency associated with the candidate timeout value meets an improvement threshold is determined. The improvement threshold may be used to ensure that a candidate timeout value is estimated to improve memory latency for a row buffer sufficiently, so as to warrant any overhead associated with updating the idle page close timeout to the candidate timeout value. As an example, the improvement threshold may specify a percentage increase (e.g., 10%, 12%, 15%, etc.) in memory latency improvement over that of a current memory latency, which a candidate timeout value must meet in order to replace a current value of the idle page close timeout.

In the case that the estimated memory latency for candidate timeout value meets the improvement threshold, then as in block 540, the value of the idle page close timeout is set to the candidate timeout value. Otherwise, as in block 530, the current value of the idle page close timeout is retained because the estimated improvement in memory latency associated with the candidate timeout value is not sufficient to warrant updating the idle page close timeout.

Figure 6:
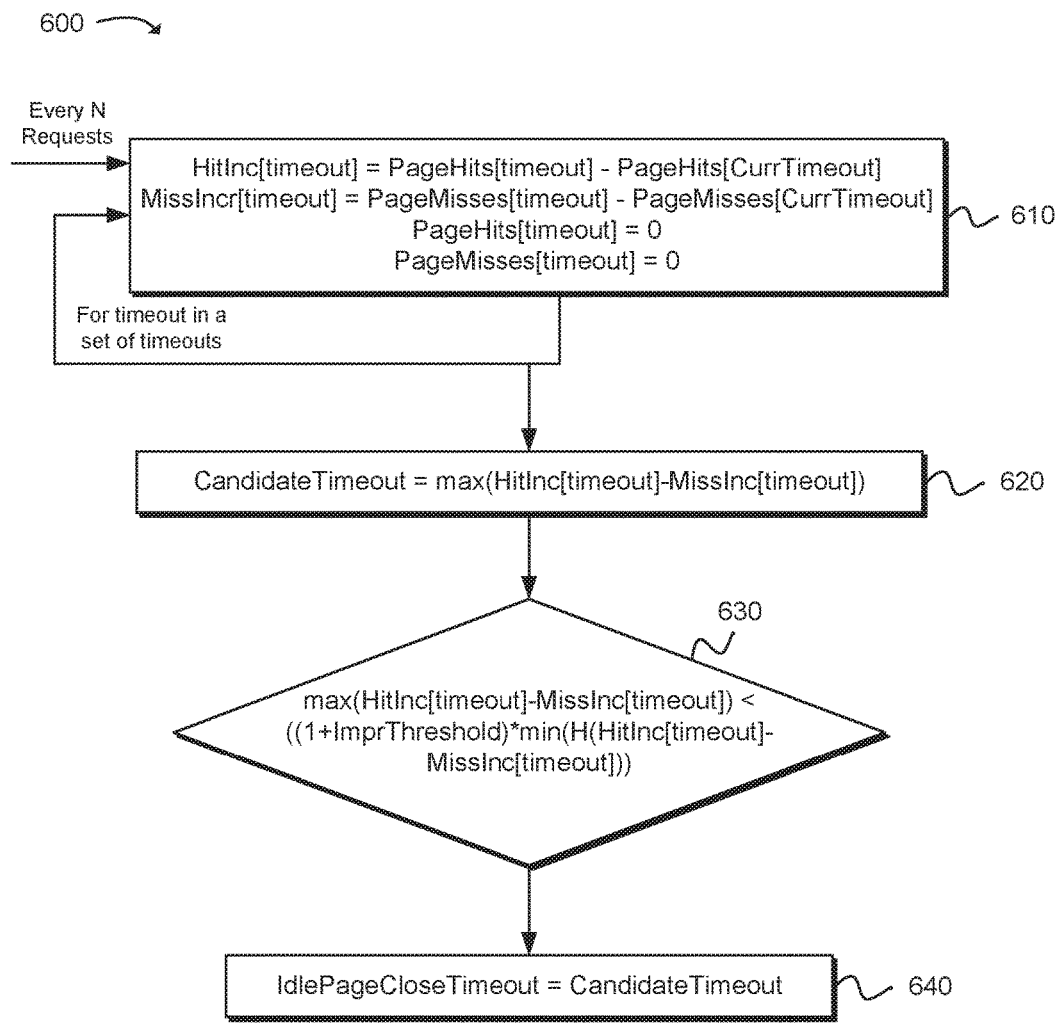
FIG. 6 is a flow diagram that illustrates an example method of determining a candidate timeout value for an idle page close timeout in accordance with an example embodiment.

FIG. 6 is a flow diagram illustrating an example method 600 of determining a candidate timeout value for an idle page close timeout of a row buffer and determining whether the candidate timeout value meets an improvement threshold. As in block 610, periodically, such as after a predetermined number of memory requests, a hit increment and a miss increment are calculated for each candidate timeout value included in a set of timeout values. After calculating a hit increment and a miss increment for a candidate timeout value, page hits and page misses for the candidate timeout value are reinitialized in a scoreboard buffer.

After hit increments and miss increments have been calculated for each candidate timeout value in the set of timeout values, the difference between the hit increments and the miss increments for each timeout value are evaluated to identify, as in block 620, a candidate timeout value having a difference that indicates maximum page hits and minimum page misses.

Next, as in block 630, a determination whether the candidate timeout value meets an improvement threshold is made. The improvement threshold may be a value that represents a minimum improvement in memory latency needed to implement the candidate timeout value. Block 630 illustrates one example method for evaluating a candidate timeout value against an improvement threshold. In the case that the candidate timeout value meets the improvement threshold, then as in block 640, the idle page close timeout is set to the candidate timeout value.

FIG. 7 is a flow diagram that illustrates an example method 700 for determining an idle page close timeout for a row buffer. As in block 710, for each notice of a memory request to a row buffer of a memory bank having an idle page close timeout, as in block 720, page hits are incremented in a scoreboard buffer for candidate timeout values included in a set of candidate timeout values that are estimated to result in a page hit for the memory request, and as in block 730, page misses are incremented in the scoreboard buffer for candidate timeout values that are estimated to result in page misses for the memory request.

As in block 740, a candidate timeout value from the scoreboard buffer estimated to maximize the number of page hits to the number of page misses is identified. The candidate timeout can be identified after receiving a predetermined number of notices of memory requests, or the candidate timeout value can be identified after receiving each notice of a memory request to the row buffer of the memory bank.

Figure 8:
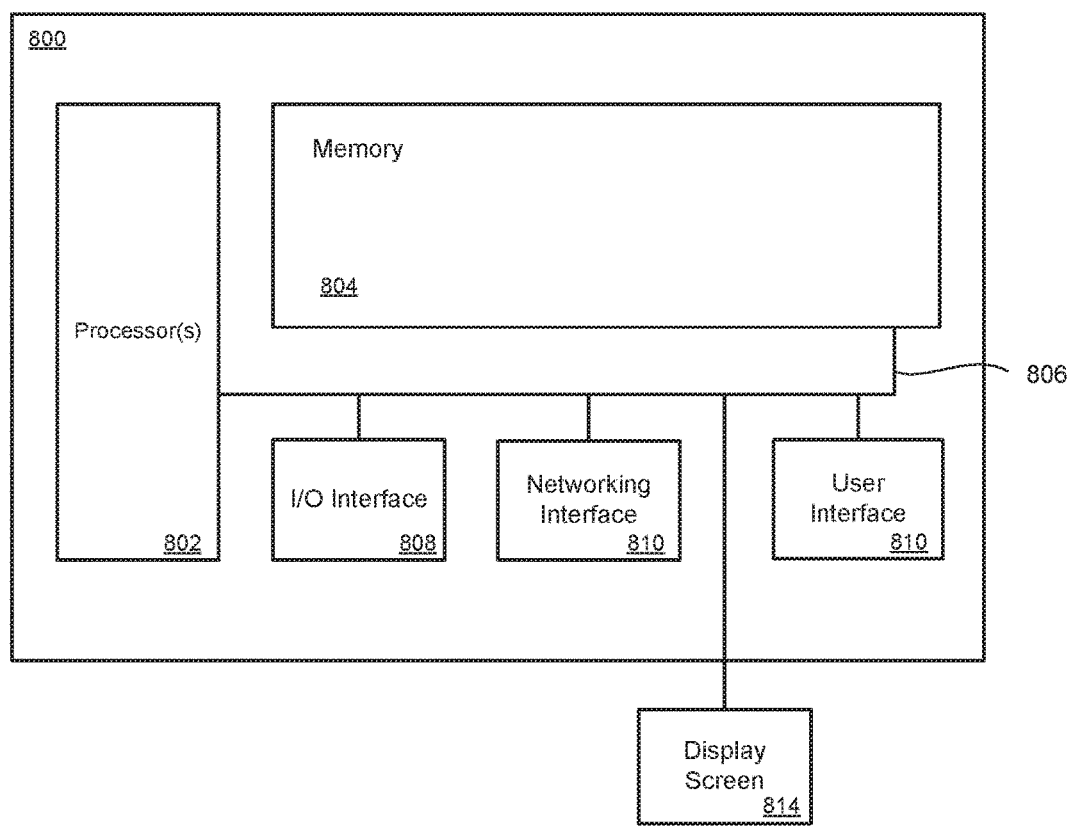
FIG. 8 illustrates a computing system that includes a memory device in accordance with an example embodiment.

FIG. 8 illustrates a general computing system or device 800 that can be employed in the present technology. The computing system 800 can include a processor 802 in communication with a memory 804. The memory 804 can include any device, combination of devices, circuitry, and the like that is capable of storing, accessing, organizing, and/or retrieving data.

The computing system or device 800 additionally includes a local communication interface 806 for connectivity between the various components of the system. For example, the local communication interface 806 can be a local data bus and/or any related address or control busses as may be desired.

The computing system or device 800 can also include an I/O interface 808 for controlling the I/O functions of the system, as well as for I/O connectivity to devices outside of the computing system 800. A network interface 810 can also be included for network connectivity. The network interface 810 can control network communications both within the system and outside of the system. The network interface can include a wired interface, a wireless interface, a Bluetooth interface, optical interface, and the like, including appropriate combinations thereof. Furthermore, the computing system 800 can additionally include a user interface 812, a display device 814, as well as various other components that would be beneficial for such a system.

The processor 802 can be a single or multiple processors, and the memory 804 can be a single or multiple memories. The local communication interface 806 can be used as a pathway to facilitate communication between any of a single processor, multiple processors, a single memory, multiple memories, the various interfaces, and the like, in any useful combination.

Various techniques, or certain aspects or portions thereof, can take the form of program code (i.e., instructions) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a RAM, EPROM, flash drive, optical drive, magnetic hard drive, solid state drive, or other medium for storing electronic data. The node and wireless device can also include a transceiver module, a counter module, a processing module, and/or a clock module or timer module. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations. Exemplary systems or devices can include without limitation, laptop computers, tablet computers, desktop computers, smart phones, computer terminals and servers, storage databases, and other electronics which utilize circuitry and programmable memory, such as household appliances, smart televisions, digital video disc (DVD) players, heating, ventilating, and air conditioning (HVAC) controllers, light switches, and the like.

EXAMPLES

The following examples pertain to specific embodiments and point out specific features, elements, or steps that can be used or otherwise combined in achieving such embodiments.

In one example, there is provided a memory controller comprising a scoreboard buffer configured to store predicted memory access results for row buffer hits and row buffer misses for a set of memory access requests over a set of candidate idle page timeout values, and a predictive timeout engine configured to determine, for each memory access request in the set of memory access requests, a timeout value from the set of candidate idle page timeout values that is either a hit conversion point or a miss conversion point along the set of candidate timeout values, store the timeout value for each memory access request in the scoreboard buffer, and dynamically adjust an idle page close timeout of a row buffer in a memory according to timeout values in the scoreboard buffer that maximize the number of hit conversions to the number of miss conversions.

In one example of the memory controller, wherein the set of memory access requests is comprised of memory controller transactions by the memory controller, the predictive engine is further configured to receive a notice of a memory controller transaction for requested data in a requested data page to a memory array with a row buffer having the idle page close timeout, identify a last data page associated with the row buffer, if the requested data page is the last data page, determine a hit conversion timeout from the plurality of candidate timeout values and increment the page hit conversions for the associated candidate timeout value, and if the requested data page is not the last data page, determine a miss conversion timeout from the plurality of candidate timeout values and increment the page miss conversions for the associated candidate timeout value. The predictive engine is further configured to identify a candidate timeout value from the scoreboard buffer that maximizes the number of page hit conversions to the number of page miss conversions, and dynamically adjust the idle page close timeout of the row buffer to the candidate timeout value.

In one example of the memory controller, the predictive timeout engine is further configured to: determine the hit conversion timeout by determining a candidate timeout value from the plurality of candidate timeout values where the row buffer converts from empty to a data page hit; and determine the miss conversion timeout by determining a candidate timeout value from the plurality of candidate timeout values where the row buffer converts from a data page miss to empty.

In one example of the memory controller, the candidate timeout value estimated to maximize the number of page hit conversions to the number of page miss conversions is identified after an evaluation period.

In one example of the memory controller, the predictive timeout engine is further configured to determine memory latency scores for the plurality of candidate timeout values using the row hit conversions and the row miss conversions.

In one example of the memory controller, a memory latency score for a timeout value is a difference between the page miss conversions and the page hit conversions for the timeout value.

In one example of the memory controller, the predictive timeout engine is further configured to: select a timeout value having a memory latency score that is associated with a decrease in memory latency from an open row in the row buffer; and set a current idle page close timeout to the timeout value having the memory latency score.

In one example of the memory controller, the predictive timeout engine is further configured to determine that the timeout value meets a memory latency improvement threshold.

In one example of the memory controller, the predictive timeout engine is further configured to reinitialize the page hit conversions and the page miss conversions in the scoreboard buffer after a current cycle.

In one example of the memory controller, the predictive timeout engine is implemented using a parallel memory controller channel.

In one example, there is provided a system comprising: a memory comprising a plurality of memory arrays; a processor; a memory controller communicatively coupled between the memory and the processor, and further comprising: a scoreboard buffer configured to store a number of page hit conversions and a number of page miss conversions for a plurality of candidate timeout values for idle page close timeouts; and a predictive timeout engine, configured to: for each notice received of a memory controller transaction for requested data in a requested data page to a memory array with a row buffer having an idle page close timeout; identify a last data page associated with the row buffer; if the requested data page is the last data page, determine a hit conversion timeout from the plurality of candidate timeout values and increment the page hit conversions for the associated candidate timeout value; if the requested data page is not the last data page, determine a miss conversion timeout from the plurality of candidate timeout values and increment the page miss conversions for the associated candidate timeout value; and identify a candidate timeout value from the scoreboard buffer that maximizes the number of page hit conversions to the number of page miss conversions.

In one example of the system, the predictive timeout engine is further configured to: in determining the hit conversion timeout, determining a candidate timeout value from the plurality of candidate timeout values where the row buffer converts from empty to a data page hit; and in determining the miss conversion timeout, determining a candidate timeout value from the plurality of candidate timeout values where the row buffer converts from a data page miss to empty In one example of the system, the timeout value is identified after an evaluation period.

In one example of the system, the predictive timeout engine is further configured to calculate a ratio of page hit conversions to page miss conversions for each of the candidate timeout values, wherein the ratio is used to determine whether the candidate timeout value is estimated to maximize the number of page hit conversions to the number of page miss conversions.

In one example of the system, the predictive timeout engine is further configured to calculate a percentage of page hit conversions to page miss conversions for each of the candidate timeout values, wherein the percentage is used to determine whether the candidate timeout value is estimated to maximize the number of page hit conversions to the number of page miss conversions.

In one example of the system, the predictive timeout engine is further configured to update a current value of the idle page close timeout to the candidate timeout value.

In one example of the system, the memory controller is integrated on a processor package with the processor.

In one example of the system, the processor package includes memory storage for the scoreboard buffer.

In one example, there is provided a method for decreasing memory access latency, comprising: receiving, from a memory controller, notices of memory controller transactions for requested data in a requested data page to a memory array with a row buffer having an idle page close timeout; for each notice received from the memory controller: identify a last data page associated with the row buffer; if the requested data page is the last data page, determine a hit conversion timeout from a plurality of candidate timeout values and increment a page hit conversion counter for the associated candidate timeout value in a scoreboard buffer; if the requested data page is not the last data page, determine a miss conversion timeout from the plurality of candidate timeout values and increment a page miss conversions for the associated candidate timeout value in the scoreboard buffer; and identify a candidate timeout value from the scoreboard buffer that maximizes the number of page hit conversions to the number of page miss conversions.

In one example of the method, determining the hit conversion timeout and the miss conversion timeout, the further comprises: determining, for the hit conversion timeout, a candidate timeout value from the plurality of candidate timeout values where the row buffer converts from empty to a data page hit; and determining, for the miss conversion timeout, a candidate timeout value from the plurality of candidate timeout values where the row buffer converts from a data page miss to empty.

In one example of the method, the method further comprises identifying the candidate timeout value from the plurality of candidate timeout values having a maximum page hit conversion count and a minimum page miss conversion count.

In one example of the method, the method further comprises applying weights to the page hit conversions, the page miss conversions, or both.

In one example of the method, the method further comprises: identifying the candidate timeout value that improves memory latency from an open row in the row buffer based in part on the page hit conversions or the page miss conversions; and determining that the memory latency for the candidate timeout value meets a latency improvement threshold.

In one example of the method, the method further comprises applying weights to the latency improvement threshold.

In one example of the method, the method further comprises updating a current value of the idle page close timeout to the candidate timeout value identified as improving memory latency from an open row in the row buffer.

In one example, there is provided a memory controller comprising a scoreboard buffer configured to store a number of page hit conversions and a number of page miss conversions for a plurality of candidate timeout values for an idle page close timeout; and a predictive timeout engine, configured to: receive a notice of a memory controller transaction for requested data in a requested data page to a memory array with a row buffer having the idle page close timeout; identify a last data page associated with the row buffer; if the requested data page is the last data page, determine a hit conversion timeout from the plurality of candidate timeout values and increment the page hit conversions for the associated candidate timeout value; if the requested data page is not the last data page, determine a miss conversion timeout from the plurality of candidate timeout values and increment the page miss conversions for the associated candidate timeout value; and identify a candidate timeout value from the scoreboard buffer that maximizes the number of page hit conversions to the number of page miss conversions.

What is claimed is:

1. A memory controller comprising:
    a scoreboard buffer configured to store predicted memory access results for row buffer hits and row buffer misses for a set of memory access requests over a set of candidate idle page timeout values; and
    a predictive timeout engine configured to:
        determine, for each memory access request in the set of memory access requests, an idle page timeout value from the set of candidate idle page timeout values that is either a hit conversion point or a miss conversion point along the set of candidate idle page timeout values;
        store the idle page timeout value for each memory access request in the scoreboard buffer; and
        dynamically adjust an idle page close timeout of a row buffer in a memory according to idle page timeout values in the scoreboard buffer that maximizes a number of hit conversion points to a number of miss conversion points.

2. The memory controller of claim 1, wherein the set of memory access requests is comprised of memory controller transactions by the memory controller, and the predictive timeout engine is further configured to:
    receive a notice of a memory controller transaction for requested data in a requested data page to a memory array with a row buffer having the idle page close timeout;
    identify a last data page associated with the row buffer;
    if the requested data page is the last data page, determine a hit conversion timeout from the set of candidate idle page timeout values and increment page hit conversions for an associated candidate idle page timeout value;
    if the requested data page is not the last data page, determine a miss conversion timeout from the set of candidate idle page timeout values and increment page miss conversions for the associated candidate idle page timeout value;
    identify a candidate idle page timeout value from the scoreboard buffer that maximizes a number of page hit conversions to a number of page miss conversions; and
    dynamically adjust the idle page close timeout of the row buffer to the candidate idle page timeout value.

3. The memory controller of claim 2, wherein the predictive timeout engine is further configured to:
    in determining the hit conversion timeout, determining a candidate timeout value from the plurality of candidate timeout values where the row buffer converts from empty to a data page hit; and
    in determining the miss conversion timeout, determining a candidate timeout value from the plurality of candidate timeout values where the row buffer converts from a data page miss to empty.

4. The memory controller of claim 2, wherein the candidate timeout value estimated to maximize the number of page hit conversions to the number of page miss conversions is identified after an evaluation period.

5. The memory controller of claim 2, wherein the predictive timeout engine is further configured to determine memory latency scores for the set of candidate idle pages timeout values using the number of page hit conversions and the number of page miss conversions.

6. The memory controller of claim 2, wherein a memory latency score for a timeout value is a difference between the page miss conversions and the page hit conversions for the timeout value.

7. The memory controller of claim 2, wherein the predictive timeout engine is further configured to:
select a timeout value having a memory latency score that is associated with a decrease in memory latency from an open row in the row buffer; and
set a current idle page close timeout to the timeout value having the memory latency score.

8. The memory controller of claim 2, wherein the predictive timeout engine is further configured to determine that the timeout value meets a memory latency improvement threshold.

9. The memory controller of claim 2, wherein the predictive timeout engine is further configured to reinitialize the page hit conversions and the page miss conversions in the scoreboard buffer after a current cycle.

10. The memory controller of claim 2, wherein the predictive timeout engine is implemented using a parallel memory controller channel.

11. A system comprising:
a memory comprising a plurality of memory arrays;
a processor;
a memory controller communicatively coupled between the memory and the processor, and further comprising:
a scoreboard buffer configured to store a number of page hit conversions and a number of page miss conversions for a plurality of candidate timeout values for idle page close timeouts; and
a predictive timeout engine, configured to:
for each notice received of a memory controller transaction for requested data in a requested data page to a memory array with a row buffer having an idle page close timeout;
identify a last data page associated with the row buffer;
if the requested data page is the last data page, determine a hit conversion timeout from the plurality of candidate timeout values and increment page hit conversions for an associated candidate timeout value;
if the requested data page is not the last data page, determine a miss conversion timeout from the plurality of candidate timeout values and increment page miss conversions for the associated candidate timeout value; and
identify a candidate timeout value from the scoreboard buffer that maximizes a number of page hit conversions to a number of page miss conversions.

12. The system of claim 11, wherein the predictive timeout engine is further configured to:
in determining the hit conversion timeout, determining a candidate timeout value from the plurality of candidate timeout values where the row buffer converts from empty to a data page hit; and
in determining the miss conversion timeout, determining a candidate timeout value from the plurality of candidate timeout values where the row buffer converts from a data page miss to empty.

13. The system of claim 11, wherein the timeout value is identified after an evaluation period.

14. The system of claim 11, wherein the predictive timeout engine is further configured to calculate a ratio of page hit conversions to page miss conversions for each of the candidate timeout values, wherein the ratio is used to determine whether the candidate timeout value is estimated to maximize the number of page hit conversions to the number of page miss conversions.

15. The system of claim 11, wherein the predictive timeout engine is further configured to calculate a percentage of page hit conversions to page miss conversions for each of the candidate timeout values, wherein the percentage is used to determine whether the candidate timeout value is estimated to maximize the number of page hit conversions to the number of page miss conversions.

16. The system of claim 11, wherein the predictive timeout engine is further configured to update a current value of the idle page close timeout to the candidate timeout value.

17. The system of claim 11, wherein the memory controller is integrated on a processor package with the processor.

18. The system of claim 17, wherein the processor package includes memory storage for the scoreboard buffer.

19. A method for decreasing memory access latency, comprising:
receiving, from a memory controller, notices of memory controller transactions for requested data in a requested data page to a memory array with a row buffer having an idle page close timeout;
for each notice received from the memory controller:
identify a last data page associated with the row buffer;
if the requested data page is the last data page, determine a hit conversion timeout from a plurality of candidate timeout values and increment a page hit conversion counter for an associated candidate timeout value in a scoreboard buffer;
if the requested data page is not the last data page, determine a miss conversion timeout from the plurality of candidate timeout values and increment a page miss conversions for the associated candidate timeout value in the scoreboard buffer; and
identify a candidate timeout value from the scoreboard buffer that maximizes a number of page hit conversions to a number of page miss conversions.

20. The method of claim 19, wherein, in determining the hit conversion timeout and the miss conversion timeout, the method further comprises:
determining, for the hit conversion timeout, a candidate timeout value from the plurality of candidate timeout values where the row buffer converts from empty to a data page hit; and
determining, for the miss conversion timeout, a candidate timeout value from the plurality of candidate timeout values where the row buffer converts from a data page miss to empty.

21. The method of claim 19, further comprising identifying the candidate timeout value from the plurality of candidate timeout values having a maximum page hit conversion count and a minimum page miss conversion count.

22. The method of claim 19, further comprising applying weights to the page hit conversions, the page miss conversions, or both.

23. The method of claim 19, further comprising:
identifying the candidate timeout value that improves memory latency from an open row in the row buffer based in part on the page hit conversions or the page miss conversions; and determining that the memory latency for the candidate timeout value meets a latency improvement threshold.

24. The method of claim 23, further comprising applying weights to the latency improvement threshold.

25. The method of claim 19, further comprising updating a current value of the idle page close timeout to the candidate timeout value identified as improving memory latency from an open row in the row buffer.

* * * * *